United States Patent [19]
Hofmann et al.

[11] Patent Number: 6,125,050
[45] Date of Patent: Sep. 26, 2000

[54] CONFIGURATION FOR DRIVING PARALLEL LINES IN A MEMORY CELL CONFIGURATION

[75] Inventors: Franz Hofmann, München; Josef Willer, Riermerling; Hans Reisinger, Grünwald; Paul-Werner Basse, Wolfratshausen; Wolfgang Krautschneider, Hohenthann, all of Germany

[73] Assignee: Siemens Aktiengesellschaft, Munich, Germany

[21] Appl. No.: 09/335,365

[22] Filed: Jun. 17, 1999

Related U.S. Application Data

[63] Continuation of application No. PCT/DE97/02654, Nov. 12, 1997.

[30] Foreign Application Priority Data

Dec. 17, 1996 [DE] Germany ............................ 196 52 538

[51] Int. Cl.$^7$ ........................................ G11C 5/02
[52] U.S. Cl. ............................ 365/51; 365/63; 365/174; 365/182

[58] Field of Search ................................ 365/51, 63, 174, 365/182

[56] References Cited

U.S. PATENT DOCUMENTS

| 5,311,465 | 5/1994 | Mori et al. ................................ 365/174 |
| 5,426,605 | 6/1995 | Van Berkel et al. .................... 365/182 |
| 5,745,407 | 4/1998 | Levy et al. ................................ 365/174 |

*Primary Examiner*—Son T. Dinh
*Attorney, Agent, or Firm*—Herbert L. Lerner; Laurence A. Greenberg; Werner H. Stemer

[57] ABSTRACT

Parallel lines, for example bit lines in a memory cell configuration formed of doped regions in a semiconductor substrate, are driven by electrically connecting a number of the lines to one another and to a common node. A number of selection lines extend transversely to the lines. MOS transistors are arranged at the points of intersection and are connected in series along one of the lines. The gate electrode of the MOS transistors is formed by the corresponding selection line. At least one MOS transistor in each of the parallel lines has a higher threshold voltage than the others.

2 Claims, 2 Drawing Sheets

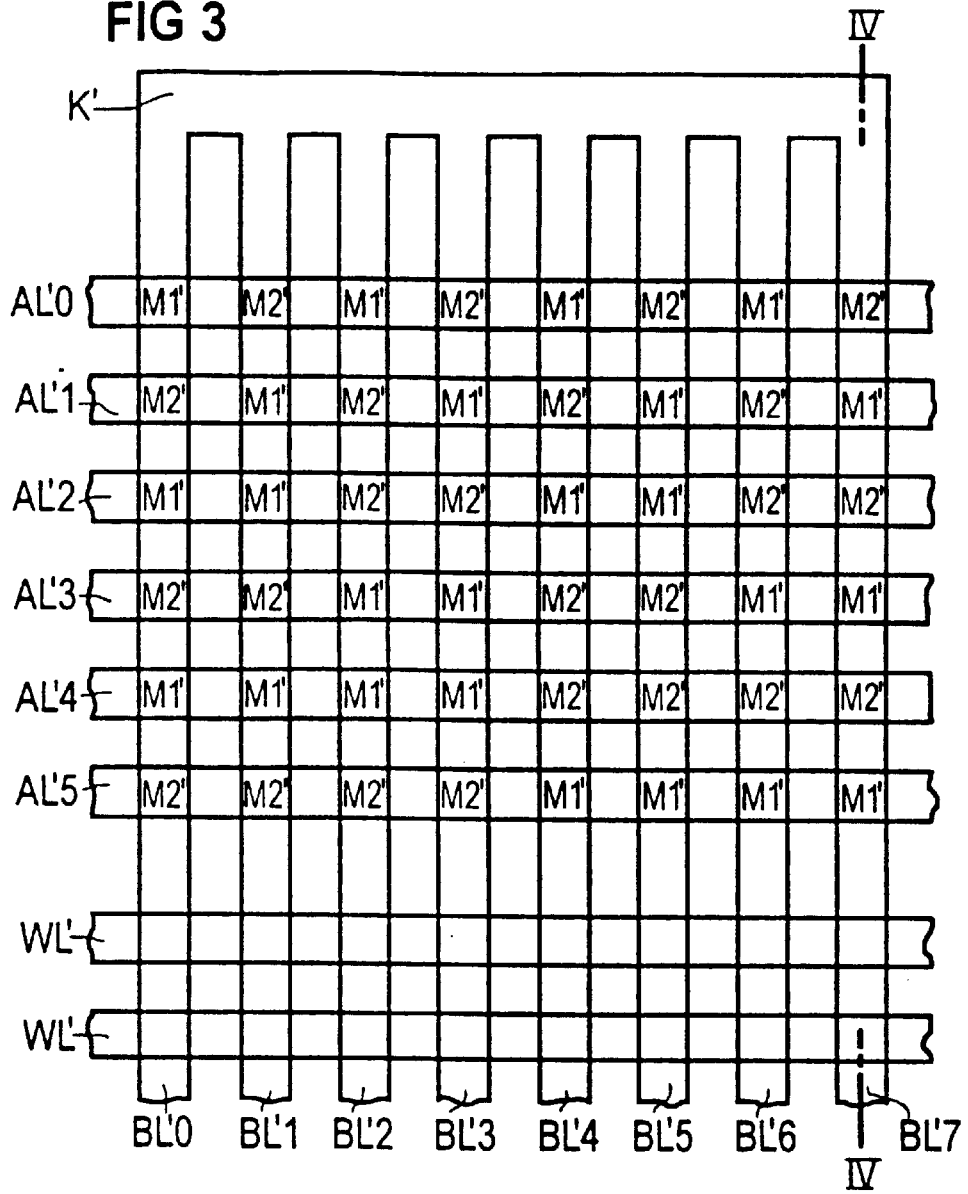
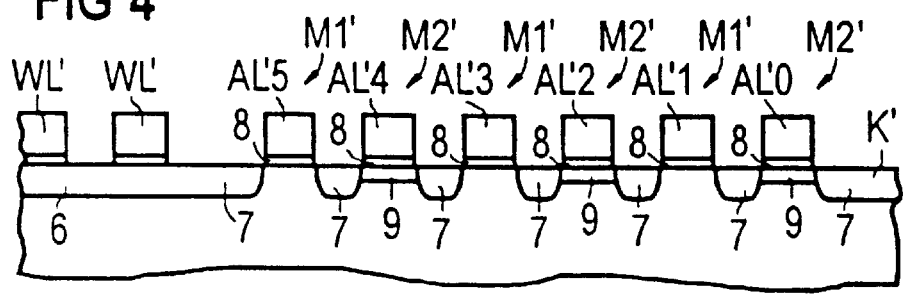

CONFIGURATION FOR DRIVING PARALLEL LINES IN A MEMORY CELL CONFIGURATION

CROSS-REFERENCE TO RELATED APPLICATION

This is a continuation of copending International Application PCT/DE97/02654, filed Nov. 12, 1997, which designated the United States.

BACKGROUND OF THE INVENTION

Field of the Invention

Individual memory cells in memory cell configurations are driven via bit lines and word lines. Each bit line and word line intersection is distinctly assigned a memory cell that can be selected by means of the intersection. This applies to all memory cell configurations, in particular dynamic and static memory cell configurations, to read-only memory cell configurations and to electrically programmable memory cell configurations.

The bit lines and word lines are usually produced as a mass of parallel lines. To select individual bit and word lines, the periphery of the memory cell configuration is provided with selector switches or decoder circuits which are electrically connected to each of the lines. The electrical connection between the bit lines and word lines and the selector switch or the decoder circuit is produced, in technological terms, by means of contact holes filled with contacts, and a metallization plane.

The requirement of etching the contact holes for connecting the parallel lines limits the packing density that can be attained.

SUMMARY OF THE INVENTION

It is accordingly an object of the invention to provide a system for driving parallel lines in a memory cell configuration, which overcomes the above-mentioned disadvantages of the heretofore-known devices and methods of this general type and which provides for an increased packing density.

With the foregoing and other objects in view there is provided, in accordance with the invention, a memory cell configuration, which comprises:

a semiconductor substrate;

a plurality of parallel lines defining bit lines of the memory cell configuration and comprising doped regions formed in the semiconductor substrate;

a predetermined number of the parallel lines being electrically connected to one another and to a common node;

a plurality of selection lines extending transversely to the parallel lines and forming intersections therewith;

the parallel lines having a number of mutually series-connected MOS transistors disposed at the intersections between the selection lines and the parallel lines and having gate electrodes formed by one of the selection lines;

at least one of the MOS transistors in each of the parallel lines having a first threshold voltage value and the other MOS transistors having a second threshold voltage value different from the first threshold voltage value;

a number $2^n$ of the parallel lines being connected to one of the common nodes;

a number $2^n$ of selection lines arranged in pairs and complementary in terms of a configuration of the MOS transistors with the first threshold voltage value and the MOS transistors with the second threshold voltage value; and a number $2^{i-1}$ MOS transistors with the first threshold voltage value and a number $2^{i-1}$ MOS transistors with the second threshold voltage value are alternately disposed in each selection line pair, wherein i is a serial index counting through the selection line pairs.

In accordance with an added feature of the invention, the second threshold voltage value is defined by additional channel doping in a respective MOS transistor.

The parallel lines to be driven comprise doped regions arranged in a semiconductor substrate. The parallel lines are bit lines.

The parallel lines are designed, for example in the region of the cell array, as strip-shaped doped regions connecting a number of adjacent memory cells to one another. Alternatively, the parallel lines in the memory cell array are designed as series-connected MOS transistors driven on the basis of NAND architecture. Memory cell configurations with such parallel lines have been described, for example, in German patents DE 44 37 581 C and DE 44 34 725 C, and in German application DE 195 10 042 A.

To drive the parallel lines, a predetermined number of the parallel lines are electrically connected to one another and to a common node. This is done by means of a further doped region, for example, which overlaps the relevant parallel lines.

A number of selection lines are provided running transversely to the parallel lines.

The parallel lines each have a number of MOS transistors connected in series. These MOS transistors are arranged in the regions where the selection lines intersect the parallel lines. The gate electrode of these MOS transistors is formed by one of the selection lines. The gate electrode is in each case formed by the selection line running above the respective MOS transistor. These MOS transistors are arranged outside the actual cell array. The MOS transistors connected in series are each arranged in the extension of the corresponding parallel line outside the cell array.

Each of the parallel lines has at least one MOS transistor having a first threshold voltage value, which differs from a second threshold voltage value for the other MOS transistors. In n-channel MOS transistors, the first threshold voltage value is higher than the second threshold voltage value. In p-channel MOS transistors, the first threshold voltage value is lower than the second threshold voltage value.

The different threshold voltage values can be produced by means of different channel dopings or by means of different gate dielectric thicknesses. The second threshold voltage value is preferably produced by providing the channel region of the MOS transistors having the second threshold voltage value with additional channel doping.

Parallel lines in the memory cell configuration are driven by applying two different levels to the selection lines. In this context, a first level lies between the first threshold voltage value and the second threshold voltage value, whilst the second level has a higher magnitude than the first threshold voltage value. The MOS transistors having the second threshold voltage value are switched on both when the first level is applied and when the second level is applied. They therefore act as resistors. On the other hand, the MOS transistors having the first threshold voltage value are switched on only when the second level is applied to the selection line forming their gate electrode.

The individual parallel lines are selected by applying appropriate levels to the selection lines and as a result of the configuration of the MOS transistors having the first threshold voltage value in the parallel lines. This means that it is not necessary to open contact holes to the individual parallel lines, which limits the packing density in the known selector switches and decoder circuits.

The configuration for driving parallel lines in a memory cell configuration can be produced both as a selector switch and as a decoder.

In a selector switch, the number of selection lines and the number of parallel lines connected to one of the common nodes are the same. Each of the parallel lines is distinctly assigned one of the selection lines. Only the point at which the parallel lines intersect the associated selection line is provided with an MOS transistor having the first threshold voltage value.

In a decoder, $2^n$ (2 to the $n^{th}$ power) parallel lines in each case are connected to one of the common nodes. $2^n$ (2 times n) selection lines are provided which, in respective pairs, are complementary in terms of the configuration of the MOS transistors having the first threshold voltage value and the second threshold voltage value. In each selection line pair, $2^{i-1}$ MOS transistors having the first threshold voltage value and $2^{i-1}$ MOS transistors having the second threshold voltage value are arranged alternately in each case. In this context, i is an integer index (serial number) which is used to count through the selection line pairs.

The decoder circuit design has the advantage that, because fewer selection lines are necessary, the circuit's space requirement is lower. On the other hand, the selector switch design has the advantage that a number of the parallel lines can be driven at the same time by applying the level to the respectively associated selection line. This is advantageous when a common voltage is applied, for example when erasing or programming.

The exemplary embodiments describe configurations having n-channel MOS transistors. The same configurations can also be produced using p-channel MOS transistors. All that happens in this case is that all the voltages change sign and different dopants are required.

Other features which are considered as characteristic for the invention are set forth in the appended claims.

Although the invention is illustrated and described herein as embodied in an configuration for driving parallel lines in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic plan view of a detail of a memory cell configuration having a 1-of-8 decoder; and FIG. 4 is a section taken along the line IV—IV in FIG. 3.

DESCRIPTION OF THE PREFERRED EMBODIMENTS

Figure 1:
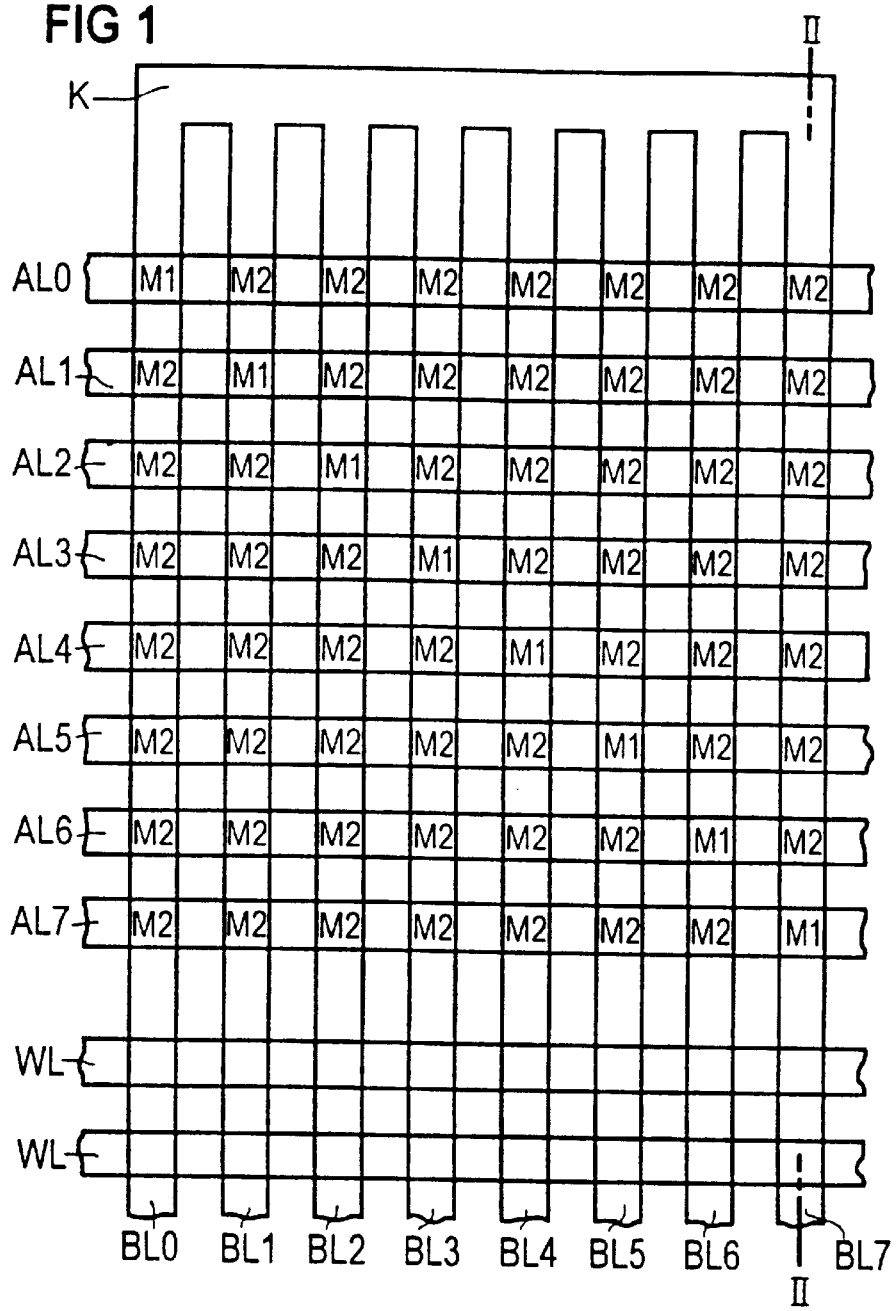
FIG. 1 is a diagrammatic plan view of a detail of a memory cell configuration having a 1-of-8 selector switch.
Figure 2:
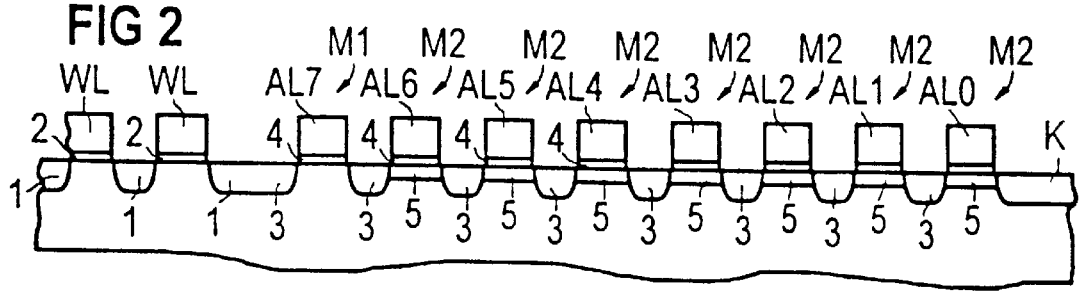
FIG. 2 is a section taken along the line II—II in FIG. 1.

Referring now to the figures of the drawing in detail and first, particularly, to FIGS. 1 and 2 thereof, there is seen a memory cell configuration with a multiplicity of parallel bit lines BLn, n=0,1, . . . 7. Parallel word lines WL run transversely to the bit lines BL. The bit lines BLn each comprise series-connected MOS transistors whose gate electrode is formed by the crossing word lines WL (see FIG. 2). Each of the MOS transistors is formed from two source/drain regions 1, the channel region arranged in between, a gate dielectric 2 disposed above the latter and the corresponding word line WL. Adjacent MOS transistors, which are connected to one another, have a common source/drain region 1.

Outside the cell array in which the word lines and bit lines BLn intersect, selection lines ALn, n=0,1, . . . 7 run transversely to the bit lines BLn (FIG. 1). The selection lines ALn run at the surface of a semiconductor substrate which contains the source/drain regions 1. The selection lines ALn are strip-shaped and are made of conductive material, for example doped polysilicon, metal silicide, or metal.

The points where the selection lines ALn intersect the bit lines BLn are each provided with an n-channel MOS transistor.

Eight respective bit lines BLn are electrically connected to one another and to a common node K. This connection is produced by a doped contact region in the substrate, for example.

The number of selection lines ALn is the same as the number of interconnected bit lines BLn, that is to say eight. Each of the bit lines BLn is distinctly assigned a selection line ALn. Each point where the associated bit lines BLn and ALn intersect is provided with an MOS transistor M1 having a first threshold voltage value. The other MOS transistors M2 have a second threshold voltage value. In this context, the second threshold voltage value is lower than the first threshold voltage value in terms of magnitude.

Each of the MOS transistors M1, M2 has two source/drain regions 3, a channel region situated in between, a gate dielectric 4 and one of the selection lines ALn as the gate electrode. Adjacent MOS transistors along a bit line BLn are connected to one another by means of a common source/drain region 3. In this way, the MOS transistors M1, M2 arranged along a bit line BLn are also connected in series with the MOS transistors arranged in the cell array. The connection between the MOS transistors arranged in the cell array and the first of the MOS transistors arranged in the region of the selection lines ALn is produced in that the source/drain region 1 and the source/drain region 3 overlap, so that they form a common doped region (see FIG. 2).

The MOS transistors M2 having the second threshold voltage, which is lower than the first threshold voltage, have additional channel doping 5 below the gate electrode. The channel doping 5 is formed, for example, by A5 implantation at a dose of $1 \cdot 10^{14}$ cm$^{-2}$ and an energy of 40 keV. The channel doping 5 is preferably designed such that the second threshold voltage value is less than zero.

To drive one of the bit lines BLn, for example BL3, for example to read a memory cell or to apply a potential, a voltage level which is higher than the first threshold voltage value is applied to the associated selection line ALn, for example AL3. The other selection lines have a voltage level applied to them which is at a level between the first threshold voltage value and the second threshold voltage value. This means that all the MOS transistors having the second threshold voltage value are switched on. They act as resistors. Of the MOS transistors M1 having the first threshold voltage value, on the other hand, the only one that is switched on is that whose gate electrode is connected to the driven selection line ALn, for example AL3. In this way, only the selected bit line BLn, for example BL3, is electrically connected to the node K. The other bit lines BLn are electrically isolated from the node, because the associated MOS transistors M1 having the first threshold voltage value are switched off. The first threshold voltage value is set to +0.5 V, for example, whilst the second threshold voltage value is set to −2.0 V, for example. The voltage levels used are 0 V and 2 V, for example.

The embodiment described corresponds to a selector switch.

In a further exemplary embodiment, a memory cell configuration comprises bit lines BL'n, n=0,1 . . . 7, running parallel (see FIG. 3). The bit lines BL'n have a strip-shaped doped region 6 which connects adjacent memory cells along a bit line BL'n to one another (see FIG. 4).

Word lines WL' run transversely to the bit lines BL'n (see FIG. 3 and FIG. 4). The word lines WL' run above a semiconductor substrate containing the strip-shaped doped regions 6 and contain conductive material, for example doped polysilicon, metal silicide, or metal.

Outside the cell array, selection lines AL'n, n=0,1 . . . 5 run transversely to the bit lines BL'n. The selection lines AL'n likewise contain conductive material, for example doped polysilicon, metal silicide, or metal.

The points where the selection lines AL'n intersect the bit lines BL'n are each provided with n-channel MOS transistors which have two source/drain regions 7, a channel region arranged in between, a gate dielectric 8 arranged above the channel region, and one of the selection lines AL'n as the gate electrode (see FIG. 4). Adjacent MOS transistors along a bit line BL'n are connected to one another by means of a common source/drain region 7. The source/drain region 7 of the last MOS transistor overlaps the strip-shaped doped region 6 and forms a common doped region with the latter. In this way, the series-connected MOS transistors are electrically connected to the strip-shaped region 6.

In this exemplary embodiment, $2^3=8$ bit lines BL'n are electrically connected to one another and to a node K' (see FIG. 3). The node K' is designed as a doped region in the semiconductor substrate and overlaps the last source/drain region 7 of the series-connected MOS transistors, so that it forms a cohesive doped region with the source/drain region 7 (see FIGS. 3 and 4).

The number of selection lines AL'n in this exemplary embodiment is 2·3=6. In each case, two selection lines AL'n form a selection line pair. In the nth selection line pair in each case, $2^{n-1}$ MOS transistors M1' having a first threshold voltage value and $2^{n-1}$ MOS transistors M2' having a second threshold voltage value are arranged alternately along the selection lines AL'n, the second threshold voltage value being lower than the first threshold voltage value. In this instance, the configuration of the MOS transistors along the selection lines of one of the selection line pairs is complementary. Hence, an MOS transistor M1' having a first threshold voltage value and an MOS transistor M2' having the second threshold voltage value are arranged alternately in each of the selection lines AL'0, AL'1. Two MOS transistors M1' having the first threshold voltage value and two MOS transistors M2' having the second threshold voltage value are arranged alternately along each of the selection lines AL'2 and AL'3. Four MOS transistors M1' having the first threshold voltage value and four MOS transistors M2' having the second threshold voltage value are arranged alternately along each of the selection lines AL'4 and AL'5.

The second threshold voltage value is produced by additional channel doping 9 in the channel region of the MOS transistors M2' (see FIG. 4). The additional channel doping 9 is produced by A5 implantation at a dose of $1·10^{14}$ cm$^{-2}$ and an energy of 40 keV.

To drive one of the bit lines BL'n, complementary selection signals are applied to each of the selection line pairs. Two selection signals are used, one of which, in terms of magnitude, is higher than the first threshold voltage value and the other of which is situated between the first threshold voltage value and the second threshold voltage value.

To select the bit line BL'4, the higher level of the selection signal is applied to each of the selection lines AL'0, AL'2 and AL'5, for example, while the lower level of the selection line signal is applied to the selection lines AL'1, AL'3 and AL'4. This means that the bit line BL'4 is connected to the node K' whereas the other bit lines BL'n are disconnected from the node K' as a result of the MOS transistors M1' having the first threshold voltage value being switched off. The MOS transistors M2' having the second threshold voltage value are also switched on if their gate electrode is driven at the lower level of the selection signal. They act as resistors.

The first threshold voltage value is set to +0.5 V, for example, the second threshold voltage value is Preferably set to less than zero, for example to −2.0 V, the higher level of the selection signal is set to 2 V, for example, and the low level of the selection signal is set to 0 V, for example.

We claim:

1. A memory cell configuration, which comprises:

a semiconductor substrate;

a plurality of parallel lines defining bit lines of the memory cell configuration and comprising doped regions formed in said semiconductor substrate;

a predetermined number of said parallel lines being electrically connected to one another and to a common node;

a plurality of selection lines extending transversely to said parallel lines and forming intersections therewith;

said parallel lines having a number of mutually series-connected MOS transistors disposed at said intersections between said selection lines and said parallel lines and having gate electrodes formed by one of said selection lines;

at least one of said MOS transistors in each of said parallel lines having a first threshold voltage value and the other MOS transistors having a second threshold voltage value different from the first threshold voltage value;

a number $2^n$ of said parallel lines being connected to one of said common nodes;

a number $2^n$ of selection lines arranged in pairs and complementary in terms of a configuration of said MOS transistors with the first threshold voltage value and the MOS transistors with the second threshold voltage value; and a number $2^{i-1}$ MOS transistors with the first threshold voltage value and a number $2^{i-1}$ MOS transistors with the second threshold voltage value are alternately disposed in each selection line pair, wherein i is a serial index counting through said selection line pairs.

2. The configuration according to claim 1, wherein the second threshold voltage value is produced as a result of additional channel doping in a respective MOS transistors.

* * * * *